(12) United States Patent
Leinonen

(10) Patent No.: US 12,158,499 B2
(45) Date of Patent: Dec. 3, 2024

(54) REGISTERS

(71) Applicant: Nordic Semiconductor ASA, Trondheim (NO)

(72) Inventor: Matti Samuli Leinonen, Oulu (FI)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 18/215,560

(22) Filed: Jun. 28, 2023

(65) Prior Publication Data
US 2024/0003971 A1    Jan. 4, 2024

(30) Foreign Application Priority Data

Jun. 30, 2022    (GB) ..................................... 2209621

(51) Int. Cl.
| | | |
|---|---|---|
| *G06F 11/10* | (2006.01) | |
| *G01R 31/3185* | (2006.01) | |
| *G06F 11/07* | (2006.01) | |
| *G06F 11/30* | (2006.01) | |
| *G06F 13/16* | (2006.01) | |
| *G06F 13/28* | (2006.01) | |

(52) U.S. Cl.
CPC ............... *G01R 31/318525* (2013.01); *G01R 31/318536* (2013.01); *G01R 31/318552* (2013.01)

(58) Field of Classification Search
CPC .... G01R 31/318525; G01R 31/318536; G01R 31/318552
See application file for complete search history.

(56) References Cited

U.S. PATENT DOCUMENTS

| | | | |
|---|---|---|---|
| 5,774,003 A |  | 6/1998 | Qureshi et al. |
| 6,629,276 B1 | * | 9/2003 | Hoffman ........ G01R 31/318552 |
| | | | 327/144 |
| 6,675,331 B1 | * | 1/2004 | Dang .................. H03K 19/096 |
| | | | 714/724 |
| 8,332,698 B2 | * | 12/2012 | Tang .............. G01R 31/318552 |
| | | | 714/726 |

(Continued)

OTHER PUBLICATIONS

Eichelberger et al., "A Logic Design Structure for LSI Testability," 1977, pp. 358-364.

(Continued)

*Primary Examiner* — Guy J Lamarre
(74) *Attorney, Agent, or Firm* — Klarquist Sparkman, LLP

(57) ABSTRACT

An integrated circuit device includes an n-bit register comprising: a plurality of latches and at least one flip-flop, and clock gating circuitry, which includes a clock signal coupled to the latches and the flip-flop. Each latch comprises a latch gating terminal configured to receive a gating signal, wherein a respective latch is configured to receive the gating signal that either corresponds to the clock signal or is determined according to a logical operation including the clock signal such that a transparency for each respective latch is controlled in dependence upon a level of the gating signal. The integrated circuit device is configured to operate in a scan test mode, wherein during a scan shift operation, an input signal terminal of the flip-flop is configured to receive a test input signal and the flip-flop is configured to load the test input signal to an output signal terminal of the flip-flop.

22 Claims, 7 Drawing Sheets

(56) References Cited

U.S. PATENT DOCUMENTS

| | | | |
|---|---|---|---|
| 2003/0169070 A1* | 9/2003 | West | G01R 31/318594 326/38 |
| 2005/0216806 A1 | 9/2005 | Verwegen | |
| 2014/0082421 A1* | 3/2014 | Marinissen | G01R 31/318575 714/34 |
| 2015/0036783 A1* | 2/2015 | Chen | G01R 31/318552 377/19 |
| 2016/0169966 A1* | 6/2016 | Abshishek | G01R 31/318541 714/727 |
| 2021/0313986 A1 | 10/2021 | Lo et al. | |

OTHER PUBLICATIONS

Holdsworth et al., "Latches and flip-flops," *Digital Logic Design (4th Edition)*, 2002, pp. 142-162.

Hui et al., "Scan Testing of Latch Arrays," *IEEE VLSI Test Symposium 1992*, 1992, pp. 31-36.

Mano et al., "Digital Design With an Introduction to the Verilog HDL," © 2013, 2007, 2002, 1991, 1984 Pearson Education, Inc., publishing as Prentice Hall, Chapter 6, pp. 255-266.

Sheth et al., "Single-Clock, Single-Latch, Scan Design," *IEEE Instrumentation and Measurement Technology Conference*, May 2002, pp. 613-615.

Tsukisaka et al., "Asynchronous Scan-Latch controller for Low Area Overhead DFT," *Proceedings of the IEEE International Conference on Computer Design*, 2004, 6 pages.

"Test Point Analysis and Insertion Control Points and Observe Points," *Tessent™ Scan and ATPG User's Manual v2021.4*, pp. 154-156.

Wang et al., "VLSI Test Principles and Architectures," © 2006 by Elsevier Inc., pp. 55-59.

* cited by examiner

REGISTERS

CROSS-REFERENCE TO RELATED APPLICATION

This application claims priority from Great Britain Application No. 2209621.8, filed Jun. 30, 2022, which application is incorporated herein by reference in its entirety.

TECHNICAL FIELD

The present invention relates to integrated circuit devices comprising one or more registers. In particular, the present invention relates to integrated circuit devices configured to operate in a scan testing mode for testing of registers.

BACKGROUND

Integrated circuits (ICs) have traditionally incorporated ever increasing amounts of digital logic on smaller areas by moving to smaller and smaller technology nodes. Registers for storage and transfer of binary data typically include an array of flip-flops for storing state information. In many register circuits, it is the case that the majority of the digital logic area is occupied by the flip-flops (e.g. D flip-flops).

One theoretical option for achieving digital logic area savings would be to replace flip-flops with latches, since an array of latches can typically occupy an area of digital logic circuitry around half that of an array of flip-flops for storing a similar number of bits since a conventional D latch typically occupies an area of digital logic that is around half that of a conventional D flip-flop. However, whilst replacing flip-flops with latches could be used to achieve a reduction in an area of an integrated circuit occupied by a register and/or reduced chip cost and/or greater storage size for a same digital logic area, the Applicant has recognised that such latch replacement would present a number of challenges.

Flip-flops, due to being edge sensitive circuits, load an input signal received at an input terminal of the flip-flop to an output terminal of the flip-flop responsive to an edge of a clock signal such that the flip-flop is triggered by the edge of the signal. Latches however are level triggered circuits and thus maintain a transparent state. Latch transparency means that a latch can thus load data at an input terminal to an output terminal at any point during the clock signal which can present a number of timing-related challenges. Therefore, when held in a transparent state (e.g. during an active level for a clock signal) input data and potentially glitches can propagate through the latch and thus potentially propagate through a number of connected and transparent latches. For this reason, when designing an integrated circuit with fault coverage considerations, previous techniques have sought to use flip-flops due to the greater level of control afforded.

Optionally, replacement of flip-flops with pulsed latches is another possibility however the use of a pulser to create pulses from a clock generally results in noticeably greater power consumption for the IC.

Fabrication of integrated circuits can result in certain defects that impact functionality of the circuitry. For example, silicon defects and/or manufacturing defects (e.g. photolithography defects) can result in shorts and opens in the transistors leading to stuck-at-one and stuck-at-zero faults in gates inside the IC. For this reason, fault testing is an important quality control step for verifying correct functioning of ICs after fabrication. Design for testability (DFT) techniques relate to designing ICs with testing capabilities to improve testing of the ICs. With DFT, testability is considered at the design stage of the IC, and logic structures for facilitating testing are included in the design to improve testing fault coverage.

Logic structures for controllability (e.g. setting certain signal terminals to certain states) and observability (e.g. observing a state of certain signal terminal) are included in the IC design for enabling various types of fault testing. Stuck-at fault testing can be used to detect a node (e.g. logic gate and/or a flip-flop) that is stuck at given state by driving a specific signal line to an opposite state than the assumed fault and observing whether the line is stuck or not. In addition, for the circuitry to behave correctly, the circuitry should not only perform the correct logical operation but also perform the operation fast enough for the change to propagate to a next flip-flop. At-speed testing refers to tests that detect delay defects from a circuit running at functional speed. Hence more generally, DFT techniques have been developed for improving testing of ICs using flip-flops.

Scan-based design is a widely used DFT approach that improves the controllability and observability ICs. The most widely used scan-based design is the muxed-D scan design developed at Stanford by M. J. Y. Williams and J. B. Angell in 1973, which uses a muxed-D scan cell made from a D flip-flop and a multiplexer, where the multiplexer selects between a data input and a scan input according to a shift enable signal and the output of the multiplexer is connected to the input of the D flip-flop. Generally speaking, a scan chain is formed by a number of flip-flops connected back to back in a chain. An input of a first flip-flop is connected to an input pin (primary input pin) of the IC to receive a scan input. The output of the last flip-flop is connected to an output pin of the IC so that a test response can be observed at the output pin, Specifically, a test pattern can be shifted in through the input pin by setting a shift enable signal high and clocking the circuit enough times to load the test pattern through the scan chain. The shift enable signal can then be set low. The circuit can then be clocked once (e.g. for a normal pattern) or many times (e.g. for sequential test pattern) to capture the test response to the flip-flops. The shift enable signal can then be set high and the test response shifted out through the scan chain and the primary output pin of the IC by clocking the circuit. Therefore, for a scan chain comprising Y flip-flops, shifting the test stimulus in and the test response out of the scan chain takes Y clock cycles.

Therefore, scan-based design allows a controlled test input signal to be applied to an input signal pin of a flip-flop scan chain and the response can be observed from an output signal pin of a flip-flop scan chain. As mentioned above, whilst replacing flip-flops with latches can be beneficial for reducing digital logic area, the transparency associated with such latches makes them generally not well suited to use in DFT techniques, and in particular in scan chains. Therefore, it is desirable to provide integrated circuitry comprising latch-based register circuitry having improved design for testability.

SUMMARY

According to a first aspect of the present invention there is provided an integrated circuit device including:
  an n-bit register comprising:
    a plurality of latches and at least one flip-flop, the plurality of latches and the flip-flop each being configured to store respective binary states corresponding to respective bits, wherein each of the plurality of latches is level-triggered and the flip-flop is edge-triggered and n is greater than or equal to three;

clock gating circuitry configured to generate a clock signal for the register and to output the clock signal at a clock signal output terminal of the clock gating circuitry; and coupling circuitry configured to couple the clock signal output terminal of the clock gating circuitry to each of the plurality of latches and the flip-flop, wherein each latch of the plurality of latches comprises a latch gating terminal configured to receive a gating signal, wherein a respective latch is configured to receive the gating signal that either corresponds to the clock signal or is determined according to a logical operation including the clock signal such that a transparency for each respective latch is controlled in dependence upon a level of the gating signal;

wherein the at least one flip-flop comprises a gating terminal configured to receive the clock signal such that loading of the flip-flop is controlled in dependence upon an edge of the clock signal received at the gating terminal; and wherein the integrated circuit device is configured to operate in a scan test mode for scan testing at least some of the integrated circuit device, wherein when in the scan test mode and during a scan shift operation an input signal terminal of the flip-flop is configured to receive a test input signal and the flip-flop is configured to load the test input signal to an output signal terminal of the flip-flop responsive to an edge of the clock signal received at the gating terminal, and wherein the integrated circuit device comprises at least one output pin to provide an observation point for the flip-flop.

Thus in accordance with at least embodiments of the present invention the integrated circuit device comprises an n-bit register using the clock gating circuitry for loading the latches and the flip-flop. The n-bit register includes the plurality of latches and the at least one flop-flop each being configured to store respective binary states corresponding to respective bits. The register has a reduced digital logic area compared to a purely flip-flop based register due to the use of the latches. The Applicant has recognised that the presence of latches can present a number of challenges, and in particular that latches can hinder scan testing of the register. However, the Applicant has recognised that by including at least one flip-flop and by providing the clock gating circuitry that generates the clock signal that is shared by each of the plurality latches and the at least one flip-flop, the output signal terminal of the at least one flip-flop can be used as an observation point for allowing scan testing that can be used to observe the functioning of the clock gating circuitry.

The integrated circuit device is configured to operate in a scan test mode for scan testing at least some of the integrated circuit device, and during a scan shift operation a test input signal is loaded by the flip-flop responsive to the edge of the clock signal and provided to the output signal terminal of the flip-flop. The integrated circuit device comprises the output pin that provides an observation point for allowing observation of the output of the flip-flop. Therefore, an integrated circuit device may include the register having the above-mentioned reduced digital logic area whilst also facilitating scan testing of the register.

Hence, embodiments of the present invention provide an integrated circuit device including at least one register comprising a plurality of latches and a flip-flop for storing respective binary states, and when operated in a scan test mode an output of the flip-flop is observed for facilitating testing of the clock circuitry without requiring the plurality of latches to be scannable. In some embodiments, the n-bit register comprises the plurality of latches and a plurality of flip-flops each being configured to store respective binary states corresponding to respective bits. For example, the integrated circuit device may comprise an 8-bit register including 6 latches and 2 flip-flops.

Preferably the n-bit register comprises fewer than n flip-flops. In other words, preferably the number of flip-flops is less than the number of bits n. It will be appreciated that this may provide a beneficial reduction in digital logic area over a purely flip-flop based n-bit register. The number of flip-flops is preferably less than half the number of bits n. The number of flip-flops is preferably less than the number of latches. However, a greatest digital logic area reduction (relative to a purely flip-flop based register) is achieved by providing an n-bit register including n−1 latches and a single flip-flop. Testing of the clock gating circuitry is facilitated by the inclusion of the single-flip flop. Hence, embodiments of the present invention provide the integrated circuit device including at least one n-bit register including n−1 latches and a single flip-flop.

Preferably the plurality of latches is arranged in parallel with each other. Preferably the one or more flip-flops are arranged in parallel with the plurality of latches. Preferably each of the plurality of latches and each of the one or more flip-flops are arranged in parallel with each other. Preferably the one or more flip-flops are not configured to receive, as an input, an output from any of the plurality of latches. The outputs of each of the plurality of latches and the one or more flip-flops are preferably provided directly as respective outputs (i.e. bits) of the register. Preferably the outputs are not provided as an output of the register via an intermediate component (e.g. a further latch or flip-flop).

In some embodiments, the at least one flip-flop of the n-bit register is included in a scan chain comprising a chain of flip-flops, and the output pin is coupled to an output signal terminal of a downstream flip-flop that is downstream from the at least one flip-flop in the scan chain. Hence, values can be shifted downstream from the at least one flip-flop of the n-bit register to a downstream flip-flop coupled to the output pin for observation. Hence more generally, the output pin may be coupled to the at least one flip-flop of the n-bit register by combinational logic. Alternatively, in some cases the output signal terminal of the at least one flip-flop of the n-bit register may be coupled to the output pin without any interconnecting combinational logic. Hence more generally, the integrated circuit device comprises at least one output pin coupled (directly or indirectly) to the output signal terminal of the flip-flop of the n-bit register to permit observation of the binary state stored by the flip-flop during the scan shift operation to thereby observe the functioning of the clock gating circuitry. Typically, the scan chain may also comprise one or more upstream flip-flops that are upstream from the flip-flop of the n-bit register. An upstream flip-flop can be coupled to an input pin of the integrated circuit device for receiving test signals to be shifted through the scan chain. In other words, an upstream flip-flop of the scan chain can be coupled to an input pin of the integrated circuit device for functioning as a scan input for the scan chain. The input pin can therefore allow control of the test input signals and the output pin can allow observation of the test responses. Hence, the integrated circuit device can be configured to operate in the scan test mode for scan testing at least some of the integrated circuit device, wherein when in the scan test mode and during the scan shift operation the input signal terminal of the flip-flop receives a scan test input signal and the flip-flop is configured to load the scan test input signal to an output signal terminal of the flip-flop responsive to an edge of the clock signal received at the gating terminal. In some examples, the integrated circuit device may comprise the input pin and the output pin, as discussed above, and may also comprise a scan mode input pin that can be used by test equipment to put the integrated circuit device into the scan test mode. Also in some examples, the integrated circuit device may further comprise a scan shift enable input pin that can be used by test equipment issuing a scan shift enable signal to enable the scan shift operation (shifting in a test pattern and/or shifting out the test response).

The Applicant has also identified that testing of the n-bit register comprising the plurality of latches and the at least one flip-flop can be further improved by introducing further digital logic for improving controllability of the testing whilst still obtaining a reduction in digital logic area relative to a purely flip-flop based n-bit register.

In some embodiments, the integrated circuit device is further configured so that each of the plurality of latches is in a transparent state when the gating signal has a high level and each of the plurality of latches is not in the transparent state when the gating signal has a low level, wherein when in the transparent state each latch is configured to load an input signal at a latch input signal terminal of the latch and to provide the input signal to a latch output terminal of the latch. The plurality of latches may each be active-high such that each latch can be maintained in a transparent state by maintaining the gating signal at a latch gating pin of the latch at a high level.

In some embodiments, when in the scan test mode and during the scan shift operation, the integrated circuit device is configured to provide the gating signal having a high level to a latch gating terminal of a latch to maintain the latch in the transparent state during the scan shift operation. The integrated circuit device in such embodiments therefore can control the gating signal received at a latch gating terminal of at least some (or all) of the plurality of latches to maintain the gating signal at the high level during the scan shift operation. Therefore, test input signals provided to a latch input terminal of latch during the scan shift operation can thus propagate through the latch to thereby improve fault testing coverage for the integrated circuit device. In particular, if a latch is in an unknown state at the end of a scan shift operation (which is the case when clock gating is used for a latch during a scan shift operation), this can result in decreased fault coverage and/or increased testing time. Embodiments of the invention maintain the latch in the transparent state during the scan shift operation so that a final binary state stored by a latch at the end of a scan shift operation is known and this can therefore provide improved fault test coverage and/or decreased testing time.

In some embodiments, the integrated circuit device further comprises control circuitry configured to output a control signal to the n-bit register to maintain the latch in the transparent state during the scan shift operation, wherein the control circuitry is configured to output the control signal having the high level when the integrated circuit device is operated in the scan test mode and during the scan shift operation. The control circuitry provides the control signal to the n-bit register, and the control signal can be provided with a high level during a scan shift operation so that the gating signal received by a latch is maintained at a high level during the scan shift operation. In some embodiments the control circuitry is configured to output the control signal having the high level when a scan shift enable signal has a high level. In other embodiments discussed below, the control circuitry further comprises logical OR circuitry for OR gating the scan shift enable signal with another signal to provide improved transparency control.

In some embodiments, the first control point comprises logical OR circuitry and the device is configured to provide a scan shift enable signal having a high level to the logical OR circuitry during the scan shift operation and the logical OR circuitry is configured to output the control signal having the high level during the scan shift operation.

The control circuitry may further comprise a control point comprising logical AND circuitry configured to receive a scan test mode enable signal and a supplementary control signal, the device being configured such that the scan test mode enable signal has a high level when the integrated circuit device is operated in the scan test mode, wherein the logical OR circuitry is configured to receive a signal output by the logical AND circuitry such that the logical OR circuitry is configured to output the control signal having the high level when the supplementary control signal has a high level and the scan test mode enable signal has the high level. In such arrangements the logical OR circuitry receives the scan shift enable signal, and thus outputs the control signal having the high level when the scan shift enable signal has the high level. The logical OR circuitry may receive both the scan shift enable signal and the signal output by the logical AND circuitry. In this way, even when the scan shift enable signal has a low level, supplementary testing of the latches of the n-bit register can be performed using the supplementary control signal and controllability of the transparency of the latches can thus be improved.

In some embodiments, the control circuitry comprises a first scan flip-flop and a second scan flip-flop, wherein an output of the first scan flip-flop is connected to an input of the second scan flip-flop, and the control circuitry is configured to generate the supplementary control signal according to a sequential test pattern. Two scan flip-flops can be used to generate the supplementary control signal so that a sequential test pattern is output to the logical AND circuitry and the corresponding control signal output by the logical OR circuitry can be used to control the transparency of the latches in accordance with the sequential test pattern. Therefore, controllability of the transparency of the latches may be improved and test input signals can be applied to an input signal terminal of a latch and the gating signal received by the latch can be controlled according to the sequential test pattern to allow controlled propagation of test input signals through the latch.

In some embodiments, the coupling circuitry comprises a latch signal path configured to couple the clock signal output terminal to each of the plurality of latches, the latch signal path comprising a logical OR circuit configured to receive the clock signal and the control signal, the logical OR circuit being configured to output, to the latch gating terminal of each of the plurality of latches, the gating signal in dependence upon a logical OR operation for the clock signal and the control signal, wherein the integrated circuit device is configured to provide, to the logical OR circuit, the control signal having a high level during the scan shift operation. The n-bit register may thus comprise coupling circuitry configured to couple the clock signal output terminal to each of the plurality of latches and the flip-flop, and the coupling circuitry can comprise the latch signal path that couples the clock signal output terminal to each of the plurality of latches, and the latch signal path can comprise the logical OR circuit (also referred to as a latch signal path logical OR circuit). The latch signal path logical OR circuit can receive the control signal from the control circuitry and also receive the clock signal that is output by the clock gating circuitry. Therefore, even when the clock signal has a low level, the control signal received by the latch signal path logical OR circuit can be used to maintain the latches in the transparent state, and the control signal can be used to maintain the latches in the transparent state during the scan shift operation. Hence, during normal operation (when the control signal provided to the latch signal path logical OR circuit has a low level) gating of the latches is dependent on the clock signal output by the clock gating circuitry, and when operating in the scan testing mode the control signal having the high level can be used for controlling latch transparency. The coupling circuitry further comprises a flip-flop signal path configured to couple the clock signal output terminal to the at least one flip-flop such that the gating terminal of the at least one flip-flop receives the clock signal without any logical OR operation. In this way, during a can shift operation, shifting in test signals to the at least one flip-flop is dependent on the clock signal and the output pin connected to the output signal terminal of the flip-flop can still be used for observing the clock gating circuitry (clock gating logic).

In some embodiments, the integrated circuit device further comprises a second register comprising a second plurality of latches, a second flip-flop and second clock gating circuitry, and wherein the control circuitry is also configured to output the control signal to the second register to maintain each of the second plurality of latches in the transparent state during the scan shift operation. The integrated circuit device can comprise any number of registers which may be the same as the above mentioned n-bit register or may be different due to storing a different number of bits. The control circuitry can output the control signal and the integrated circuit device can comprise connection circuitry connecting the control circuitry to the n-bit register and the second register so that the control signal can be shared with the two registers.

More generally, the integrated circuit device may comprise a plurality of latch registers each comprising a plurality of latches, at least one flip-flop and clock gating circuitry, and the control circuitry can be configured to provide the control signal to each of the plurality of latch registers to thereby control transparency of each of the latches included in each latch register. In some examples, the plurality of latch registers may be included in a same register bank or may be included in a plurality of register banks. Hence more generally, the control circuitry can be shared by a plurality of latch registers and this can allow improved controllability for scan testing of the latch register whilst achieving a reduction in digital logic area compared to an array of registers comprised solely of flip-flops. In addition, sharing of the same control circuitry by the latch registers is beneficial for achieving low power consumption.

In some embodiments, the second register comprises second coupling circuitry comprising a second latch signal path configured to couple a second clock signal output terminal of the second clock gating circuitry to each of the second plurality of latches, and wherein the second latch signal path comprises a second logical OR circuit configured to receive the control signal and a second clock signal generated by the second clock gating circuitry, the second logical OR circuit being configured to output, to a latch gating terminal of each of the second plurality of latches, a gating signal in dependence upon a logical OR operation using the second clock signal and the control signal. Hence more generally, both the n-bit register and the second register can comprise a respective logical OR circuit that receives the control signal from the control circuitry for controlling the transparency of the latches in that register. In this way, the control signal can be shared with a plurality of latch registers for maintaining the latches in a transparent state during scan testing. In addition, stuck-at fault testing of the logical OR circuit can be performed by providing the control signal to the logical OR circuit and using a downstream observation point (downstream of the latches) to observe an output from a latch output terminal of a latch.

In some embodiments the integrated circuit device further comprises scan shift enable control circuitry configured to output a scan shift enable control signal to the n-bit register, wherein the clock gating circuitry comprises a shift enable control input terminal configured to receive the scan shift enable control signal and the clock gating circuitry is configured to output the clock signal at the clock signal output terminal in dependence upon the scan shift enable control signal so that the clock signal is enabled for the n-bit register during the scan shift operation, such that the gating terminal of the flip-flop receives the clock signal during the scan shift operation. Therefore, the clock gating circuitry of the n-bit register can be enabled by the scan shift enable control signal provided by the scan shift enable control circuitry, and the corresponding clock signal output by the clock gating circuitry can be used to clock the at least one flip-flop during the scan shift operation to permit scan testing of the n-bit register.

In some embodiments, the integrated circuit device further comprises a plurality of registers each comprising: a plurality of latches, at least one flip-flop; and clock gating circuitry comprising a shift enable control input terminal, and wherein the scan shift enable control signal control circuitry is also configured to output the scan shift enable control signal to each of the plurality of registers to enable the clock gating circuitry of each of the plurality of registers during the scan shift operation so that the clock gating circuitry of each of the plurality of registers is configured to output the clock signal during the scan shift operation. Hence more generally, the scan shift enable control circuitry can output the scan shift enable control signal to the n-bit register and to the clock gating circuitry included in each register so as to allow testing in parallel of each of the registers.

In some embodiments, the n-bit register comprises the plurality of latches and at least one of the plurality of latches comprises a latch reset terminal configured to receive a reset control signal for resetting the latch to a default binary state, and wherein the integrated circuit device further comprises reset control circuitry configured to output the reset control signal to the n-bit register. The reset control circuitry can be provided to output the reset control signal to at least some (or all) of the latches of the n-bit register. The reset control signal resets the latch to the default binary state which can be useful for stuck-at fault testing of the latch reset terminal.

In some embodiments, the reset control circuitry comprises a control point and the integrated circuit device is configured to disable the control point during the scan shift operation. The reset control circuitry can be used to provide the reset control signal to the n-bit register before or after a scan shift operation. During the scan shift operation, the integrated circuit device can disable the control point to prevent the latch from being reset to the default binary state by the reset control circuitry.

In some embodiments, the latch is configured to store a binary state from a previous scan shift operation, and when in the scan test mode and before the scan shift operation, the integrated circuit device is configured to provide, to the latch reset terminal of the latch, the reset control signal for resetting the latch to the default binary state, wherein during the scan shift operation the integrated circuit device is configured to capture the default binary state to a downstream flip-flop, and wherein the integrated circuit device is configured to shift the default binary state downstream from the downstream flip-flop to another downstream flip-flop connected to another output pin of the integrated circuit device to provide an observation. More generally, a value (binary state) opposite to the reset value (default binary state) of the latch can be initially shifted in using one or more flip-flops upstream of the latch (e.g. in PWDATA). The value can thus be loaded by the latch. The reset control circuitry can then either reset the latch to the reset value or not. An observation of the latch value downstream from a flip-flop (e.g. in read logic) can be used to enable testing equipment to check that the value was reset to default when it should have and not reset to default when it should not have. Hence, an observation of the state of the latch can be used for performing stuck-at testing of the latch reset terminal.

In some embodiments, the control point comprises logical AND circuitry configured to receive a supplementary reset control signal and an inverse of a scan shift enable signal and to output the reset control signal in dependence upon the received signals so that resetting of the respective latch to the default binary state is disabled during the scan shift operation, and wherein the reset control circuitry further comprises a multiplexer control point configured to select and output the reset control signal when the integrated circuit device is operated in the scan test mode.

In some embodiments, the integrated circuit device further comprises a second register comprising a second plurality of latches, a second flip-flop and second clock gating circuitry, and wherein the reset control circuitry is configured to output the reset control signal to the second register for resetting one or more of the second plurality of latches to the default binary state. Therefore, the reset control circuitry can be shared by a plurality of latches facilitating reduction in digital logic area.

In some embodiments, the reset control circuitry comprises a first scan flip-flop and a second scan flip-flop, wherein an output of the first scan flip-flop is connected to an input of the second scan flip-flop, and the reset control circuitry is configured to generate the supplementary reset control signal according to a sequential test pattern.

In some embodiments, each of the plurality of latches included in the n-bit register is a positive level active latch comprising a latch input signal terminal connected to a respective negative level active latch for receiving an input signal from the respective negative level active latch. Hence, a negative level active latch having a latch output terminal can be coupled to a latch input terminal of a latch of the n-bit register for loading the latch.

In some embodiments, the integrated circuit device comprises a plurality of negative level active latches, in which at least one negative level active latch has a latch output terminal coupled to a first latch input terminal of a first latch in the n-bit register and also coupled to respective latch input terminal of another latch in another latch register. Each of the plurality of latches included in the n-bit register comprises a respective latch input signal terminal connected to a respective negative level active latch, such that the first latch of the n-bit latch register is connected to a first negative level active latch, and a second latch of the n-bit latch register is connected to a second negative level active latch and so on for each of the plurality of latches in the n-bit register. In addition, the first negative level active latch can be shared with another positive level active latch included in another latch register in a same register array (register bank) as the n-bit register. In some such embodiments, the first negative level active latch may also be shared with one or more further latches in one or more further latch registers in the same register array. Hence more generally, a single negative level active latch can be coupled to a plurality of positive level active latches each included in a separate latch register in a same register array. Sharing of a negative level active latch by a plurality of latch registers in this way can allow for significant digital logic area savings for a register array.

BRIEF DESCRIPTION OF THE DRAWINGS

Certain embodiments of the present invention will now be described by way of example only, and with reference to the accompanying drawings, in which.

DETAILED DESCRIPTION

In the following description, a number of specific details are presented in order to provide a thorough understanding of the aspects of the present disclosure. It will be apparent, however, to a person skilled in the art that these specific details need not be employed to practice the techniques of the present disclosure. Conversely, specific details known to the person skilled in the art are omitted for the purposes of clarity where appropriate.

Figure 1:
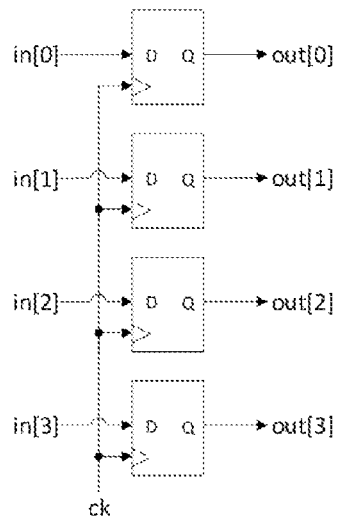
FIG. 1 is a schematic diagram illustrating an example of a register comprising flip-flops for binary data storage.

FIG. 1 schematically illustrates an example of a four-bit register comprising four flip-flops. This type of register is an important building block in many digital circuits. A simple register with no combinational logic, like in FIG. 1, transfers the data from its inputs to the outputs on each clock edge. Whilst FIG. 1 shows an example of a four-bit register, more generally a group of n flip-flops using a common clock (or different clocks) can be used to form an n-bit register for storing n-bits of binary data. An integrated circuit may generally comprise a register bank comprising a plurality of such registers for storing and transferring binary data, in which each register may store a same or different number of bits. For example, a register bank may comprise a first register comprising n flip-flops for storing n-bits and a second register comprising m flip-flops for storing m-bits, where n and m may be different or the same. FIG. 1 represents a simplified view of a register array and typically such register arrays include further functionality to control how data is transferred to the flip-flops.

Generally, it is desirable to reduce an overall size of an integrated circuit and thus a size of a processing device and/or to reduce an area of an integrated circuit used for registers so as to potentially include further functionality on a chip. One possibility for achieving such a reduction is to replace the flip-flops in a register with latches to thereby reduce an area of an integrated circuit that is used for registers.

However, due to the complexity of the manufacturing processes used in integrated circuit fabrication, fault testing of integrated circuits is also an important consideration. The characteristics of latches, specifically latch transparency, has generally meant that ICs using latch-based registers have poorer fault coverage testing and/or the addition of further DFT logic (test logic) for fault testing has resulted in any area reduction benefit obtained by replacing flip-flops with latches being lost. Therefore embodiments of the present invention provide an integrated circuit device comprising at least one latch-based register for storing binary state information, and the integrated circuit device is configured to operate in a scan testing mode for enabling scan testing of the latch-based register.

Moreover, embodiments of the present invention provide an integrated circuit device comprising at least one n-bit latch-based register for which the n-bit latch-based register has a reduced digital logic area compared to an n-bit flip-flop register comprising n flip-flops, and also has functionality for allowing scan testing of at least some of the latch-based register. Specifically, whilst previous attempts to enable scan testing of latch-based registers have resulted in the use of scan test logic that negates any digital logic area saving achieved by using latches instead of flip-flops, embodiments of the present invention provide an integrated circuit device that facilitates scan testing of the latch-based register whilst achieving a reduced digital logic area compared to a flip-flop register.

Moreover, some embodiments of the present invention can provide integrated circuitry achieving the above mentioned digital logic area reduction whilst also achieving stuck-at fault testing coverage that is comparable to (or in some cases substantially equal to) that achieved using purely flip-flops. In the following discussion, an n-bit register using n flip-flops is referred to as a reference design for demonstrating the benefits that may be achieved in accordance with the present invention.

Figure 2:
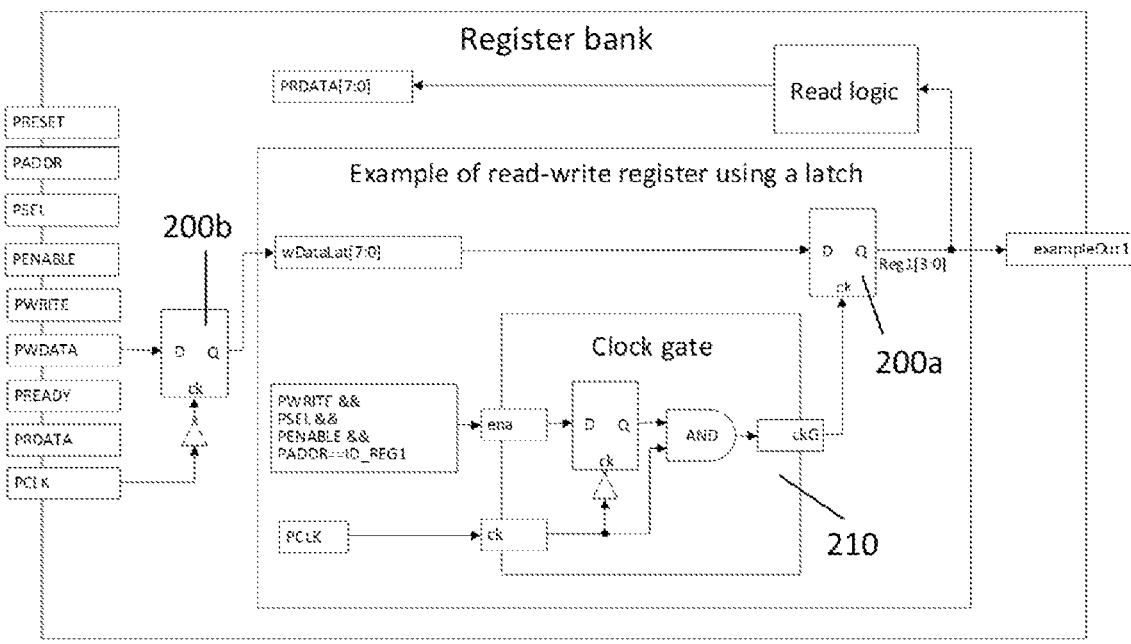
FIG. 2 is a schematic diagram illustrating an example of a read-write register including a latch and clock gating circuitry.

FIG. 2 schematically illustrates an example of a read-write register using a latch 200a for storing a binary state corresponding to a respective bit and clock gating circuitry 210. As shown in FIG. 2, the register uses the latch 200a as a storage element and uses a clock signal generated by the clock gating circuitry 210 to control loading of the latch 200a. The clock gating circuitry 210 generates the clock signal (ckG) and the clock signal is received at a latch gating terminal of the latch 200a for controlling loading of the latch 200a so that data is loaded from an input signal terminal (D) to an output signal terminal (Q) of the latch 200a on the high level for the clock signal.

In this example, the clock gating circuitry 210 comprises a negative level triggered latch and a logical AND gate which are used to generate the clock signal ckG (based on the signal PCLK) for controlling loading of the latch 200a. Hence, the clock gating circuitry 210 comprises logic for deriving the clock signal ckG. The write data (PWDATA) is latched to the input signal terminal of the latch 200a using another latch 200b. The further latch 200b is a low level active latch such that the latch 200b is loaded during a low level.

FIG. 2 therefore provides an example of integrated circuitry comprising a latch-based register having reduced area compared to a flip-flop based register at least due to the latch 200a having a smaller footprint than a flip-flop. Whilst FIG. 2 illustrates an example using a single latch (latch 200a) for storing a binary state indicative of a bit value, the register may comprise a plurality of such latches to store a plurality of respective bit values. In particular, the clock signal (ckG) may be used for clock gating a plurality of latches. For example, in the case of a parallel load register, the same clock signal (ckG) can be received by each of the plurality of latches. Moreover, whilst FIG. 2 illustrates an example using a single register, the techniques of the present disclosure extend to integrated circuitry comprising a plurality of such registers (an array of registers), in which one or more of the registers have the functionality described with reference to FIG. 2.

The applicants have identified that integrated circuitry comprising a latch register for storing n-bits can be fault tested with a test coverage that can be comparable to (or in some cases substantially equal to) that achieved for an n-bit register using n flip-flops whilst achieving a smaller footprint.

For an n-bit register comprising n scannable flip-flops, faults in the clock gating circuitry (specifically the combinational logic associated therewith) can be seen in whether a signal output by a scannable flip-flop is updated in accordance with expected behaviour for a clock signal output by the clock gating circuitry, because on the active edge of a clock the data input of a flip-flop is transferred to the output. By inputting a test signal and observing the signal output by a scannable flip-flop, a fault in the clock circuitry can be identified.

However, as latches are transparent on the active level of the clock signal and thus load data to the output at any point on the active level of the clock signal, observing the effect of the clock signal output by the clock circuitry 210 typically would require an observation downstream of the latches (e.g. using downstream scannable flip-flops connected to an output of a latch). Such an IC design also means that in an array of latch registers, only a single latch register in the array can be observed at a time from the downstream scannable flip-flops (e.g. in the read logic). Therefore, testing of the clock gating circuitry for each of a plurality of latch registers cannot be performed in parallel and scan testing for an array of latch registers can be time consuming. In addition, the consequential reduced observability results in a large decrease in the fault test coverage. Embodiments of the present invention provide an integrated circuit device comprising register circuitry (e.g. register bank) comprising one or more registers, in which at least one of the registers comprises a plurality of latches and a flip-flop. The register also comprises clock gating circuitry configured to generate a clock signal for the register, such that the clock signal is shared by each of the plurality of latches and the flip-flop. As explained in more detail later, the clock signal output from a clock signal output terminal of the clock gating circuitry is coupled to each of the plurality of latches and the flip-flop. Each of the plurality of latches receives a gating signal that either corresponds to the clock signal generated by the clock gating circuitry or is determined according to a logical operation including the clock signal. The flip-flop receives a clock gating signal corresponding to the clock signal generated by the clock gating circuitry.

The integrated circuit device, when operated in the scan test mode can perform a scan shift operation for which a test input signal is received at the input signal terminal of the flip-flop and is loaded by the flip-flop responsive to an edge of the clock gating signal received by a gating terminal of the flip-flop. Therefore, during the scan shift operation the test input signal is loaded from the input signal terminal of the flip-flop to the output signal terminal of the flip-flop responsive to an edge of the clock signal such that the flip-flop is effectively enabled on the edge of the clock gating signal received at the gating terminal of the flip-flop. An output signal that is output by the output signal terminal is monitored (observed) using an output pin on the IC device coupled (directly or indirectly by combinational logic) to the output signal terminal of the flip-flop to provide an observation point for the flip-flop. Consequently, observation of the output signal terminal of the flip-flop during the scan shift operation, via the output pin, can be used to observe and thus test the correct functioning of the clock gating circuitry.

The integrated circuit device comprises the output pin for permitting observation of the output signal terminal of the flip-flop. Specifically, the flip-flop in the n-bit register can be a scan flip-flop included anywhere in a scan chain. An output signal terminal of a last flip-flop of the scan chain can be connected to the output pin to thereby couple the output pin to the flip-flop in the n-bit register. In this way, test signals can be shifted through the scan chain and the response of the flip-flop in the n-bit register to the test signals can be shifted through the scan chain to the last flip-flop such that test equipment can be connected to the output pin to allow observation of the clock signal received by the flip-flop in the n-bit register. Alternatively, the flip-flop in the n-bit register may for example be a last flip-flop of a scan chain, in which case the output pin can be directly coupled to the signal terminal of the flip-flop in the n-bit register. hence more generally, test input signals can be shifted thorough the flip-flop and shifted out test signals can be observed via the output pin of the IC, such that if a shifted out value is different to what is expected this indicates that the clock signal input to the flip-flop is not functioning correctly. Observation of the state of the flip-flop being updated in a manner expected for the test input signal can be used to test the correct functioning of the clock gating circuitry. Hence, the output signal terminal of the flip-flop can be coupled to an external output pin (also referred to as a direct output terminal for the integrated circuit device) to thereby allow observation of the clock signal generated by the clock gating circuitry during scan testing.

For example, manufacturing testing of digital logic is typically done with the help of automatic test equipment (ATE) and automatic test pattern generation (ATPG) tools. ATPG tools typically use algorithms to generate test input patterns so that a response to the test input patterns can be observed for detecting faults in an IC. An ATPG tool can be used to generate the test input signals applied to the input signal terminal of the flip-flop and observation, via the output pin coupled to the output signal terminal of the flip-flop, of the response to the test input signals can be used to enable scan testing of the clock gating circuitry.

Consequently, embodiments of the present invention provide an integrated circuit device including at least one register comprising a plurality of latches and a flip-flop for storing binary data, and when operated in a scan test mode an output of the flip-flop is observed for facilitating testing of the clock circuitry without requiring the latches to be scannable. In this way, the register provided by the present invention has a smaller area compared to a conventional n-bit register array comprising n flip-flops whilst also allowing testing of the clock gating circuitry.

Embodiments of the present invention extend to the integrated circuit device comprising a register comprising a plurality of latches and a plurality of flip-flops each providing binary state storage functionality (e.g. an 8-bit register having 6 latches and 2 flip-flops). However, by specifically providing a register using a plurality of latches and a single flip-flop (instead of two or more flip-flops) an on-chip area of the register can be most greatly reduced whilst still enabling observation of the clock gating circuitry via the single flip-flop.

Therefore, in some embodiments of the disclosure, the register has a bit depth of n bits and comprises n−1 latches and the flip-flop. For example, the register may be an 8-bit register having 7 latches and 1 flip-flop. Specifically, the flip-flop may for example be used for storing a first bit of the register. In a simplest case, the register has a bit depth of 3 bits made up of 2 latches and 1 flip-flop.

Figure 3:
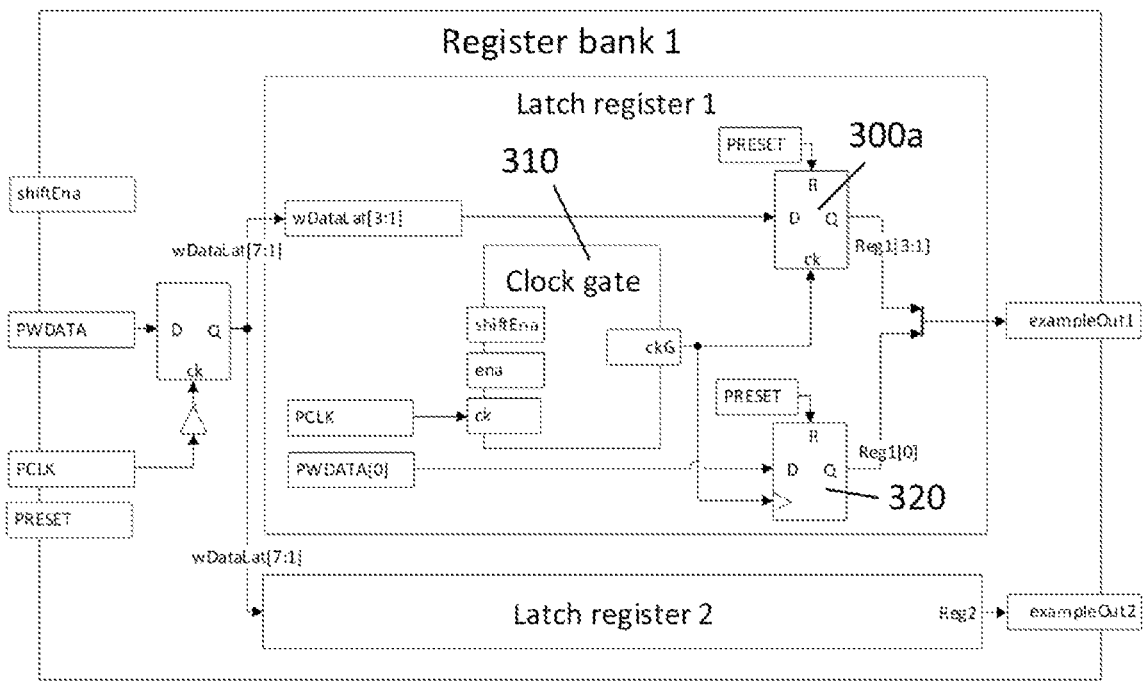
FIG. 3 is a schematic diagram illustrating a register including a latch, a flip-flop and clock gating circuitry.

FIG. 3 schematically illustrates an example of such a register, in which a latch 300a and a flip-flop 320 are shown as sharing a same clock signal generated by the clock gating circuitry 310. Hence, when operating in the scan testing mode, an observation node for observing the output signal terminal of the flip-flop 320 can be used whilst shifting one or more test input signals through the flip-flop 320 to thereby observe and facilitate testing of the clock gating circuitry 310.

Whilst the arrangement of FIG. 3 facilitates testing of the clock gating circuitry 310 whilst also achieving a reduction in on-chip area for the register by using latches for storing binary state information, the presence of the latches generally results in less observability and controllability compared to an n-bit register including n scannable flip-flops. The applicants have also identified that fault testing of a register comprising a plurality of latches and a flip-flop can be further improved by introducing further logic for assisting with testing whilst still obtaining a reduction in digital logic area relative to the reference n-bit register using flip-flops. In particular, the techniques to be discussed below provide logic circuits that improve fault coverage for a register comprising a plurality of latches and a flip-flop by improving controllability and observability.

Embodiments of the invention provide an integrated circuit device including a register comprising a plurality of latches and a flip-flop, the integrated circuit device having a normal mode of operation and a scan test mode, and when in the scan test mode the integrated circuit device can perform a scan shift operation. When the integrated circuit device is operating in the scan test mode and during a respective scan shift operation, a latch gating terminal of a respective latch of the register receives a gating signal having a high level to maintain the respective latch in a transparent state during the scan shift operation. Moreover, the integrated circuit device comprises one or more logic circuits for controlling the gating signal received by at least one latch during a scan shift operation to hold the latch in a transparent state (so that data can propagate through the latch) for a controlled period of time.

Typically, clock gating for a respective latch can mean that a scan shift operation, in which test input signals are shifted through a sequential logic circuit, can be hindered due to latches having an unknown state at the end of a scan shift operation, thereby resulting in decreased fault coverage and/or increased testing time. By ensuring that latches are maintained in a transparent state during a scan shift operation, respective states stored by the latches at the end of the scan shift operation can be known. Conversely, if latches are not transparent during a whole scan shift operation, the latches can update their state at unknown points during the scan shift operation and their state is thus unknown at the end of the scan shift operation thereby hindering scan testing.

The integrated circuit device in accordance with embodiments of the present invention can comprise logic circuits for controlling a gating signal received by one or more respective latches of the register during a scan shift operation to maintain the gating signal at a high level during the scan shift operation and thereby improving scan testing.

Figure 4A:
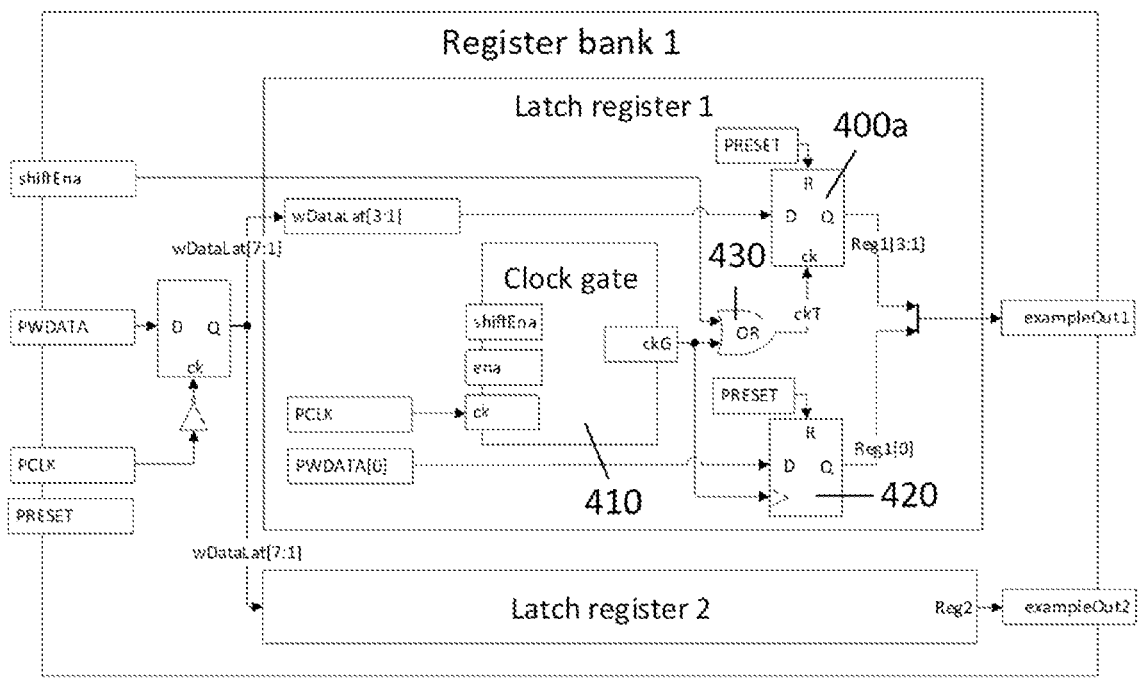
FIG. 4a is a schematic diagram illustrating a register for which transparency of a latch is maintained during a scan shift operation by OR gating a clock signal with a shift enable signal.

In some embodiments, the gating signal received at a latch gating terminal of a respective latch is determined according to a logical operation including the clock signal generated by the clock gating circuitry and a control signal. FIG. 4a schematically illustrates a register (latch register 1 in FIG. 4a) in accordance with an embodiment of the present invention. The register comprises a latch 400a and a flip-flop 420 which are both coupled to the clock gating circuitry 410. The gating terminal of the flip-flop 420 is connected to the clock signal output terminal of the clock gating circuitry 410 such that the loading of the flip-flop 420 is controlled in dependence upon an edge of the clock signal received at the gating terminal (as discussed previously).

However, the latch gating terminal of the respective latch 400a is connected to the clock signal output terminal of the clock circuitry 410 via a logical OR circuit 430. Consequently, the latch gating terminal receives a gating signal determined according to a logical OR operation including the clock signal. Specifically, the logical OR circuit 430 receives the clock signal generated by the clock gating circuitry 410 and a control signal (schematically shown as "ShiftEna" in the example of FIG. 4a). The latch gating terminal therefore receives a gating signal determined according to a logical OR operation including the clock signal and the control signal. The control signal is generated by the integrated circuit device to have a high level during a scan shift operation so that the gating signal received by the respective latch has a high level during the scan shift operation. Consequently, the latch 400a can be controlled to maintain a transparent state during the scan shift operation so that data (i.e. a sequence of test input signals) propagates through the respective latch 400a and a state of the latch at the end of the scan shift operation can be reliably known.

Therefore, such embodiments of the invention improve fault coverage relative to the register shown in FIG. 3 by providing the control signal and the logical OR circuit 430 for controlling transparency of the latch 400a when operating in the scan test mode. In particular, this allows the latch 400a to be maintained in a transparent state when one or more test signals are being passed through the latch.

FIG. 4a schematically illustrates an example showing a register (latch register 1) including three latches and a single flip-flop so that the latch data signal comprises three bits—although for clarity only one latch 400a is shown. More generally, embodiments of the invention provide an integrated circuit device comprising an n-bit register, the n-bit register comprising a plurality of latches and a flip-flop (e.g. a 3 or more-bit register including two or more latches 400a and a flip-flop). The clock gating circuitry 410 generates the clock signal which is shared by each of the plurality of latches and the flip-flop. Such an integrated circuit device comprises coupling circuitry configured to couple the clock signal output terminal of the clock gating circuitry 410 to each of the plurality of latches and the flip-flop and, as shown in FIG. 4a, the coupling circuitry comprises a latch signal path and a flip-flop signal path.

The latch signal path couples the clock gating circuitry 410 to each of the plurality of latches and comprises the logical OR circuit 430 configured to receive the clock signal and the control signal. The logical OR circuit 430 is configured to output, to the latch gating terminal of each of the plurality of latches, the gating signal in dependence upon a logical OR operation for the clock signal and the control signal, for which the control signal has a high level during the scan shift operation. Hence, each respective latch receives a gating signal that is obtained by OR gating the clock signal output by the clock gating circuitry 410 with the control signal, and each of the plurality of latches can therefore be controlled to maintain a transparent state during a scan shift operation.

The flip-flop signal path couples the clock gating circuitry 410 to the flip-flop 420 such that the gating terminal of the flip-flop 420 receives the clock signal (without any OR operation), and thus loading by the flip-flop is controlled according to the edge of the clock signal (i.e. the clock to the flip-flop is taken from before the OR gating, and thus shifting in values to the at least one flip-flop is dependent on the clock signal). Therefore, the arrangement of FIG. 4a allows testing of the clock gating circuitry 410 using the output pin to observe the output signal terminal of the flip-flop 420. The control signal and the logical OR circuit 430 can be used for controlling the transparency of the latches to have a transparent state during the scan shift operation. Therefore, fault testing of the register is improved.

Figure 4B:
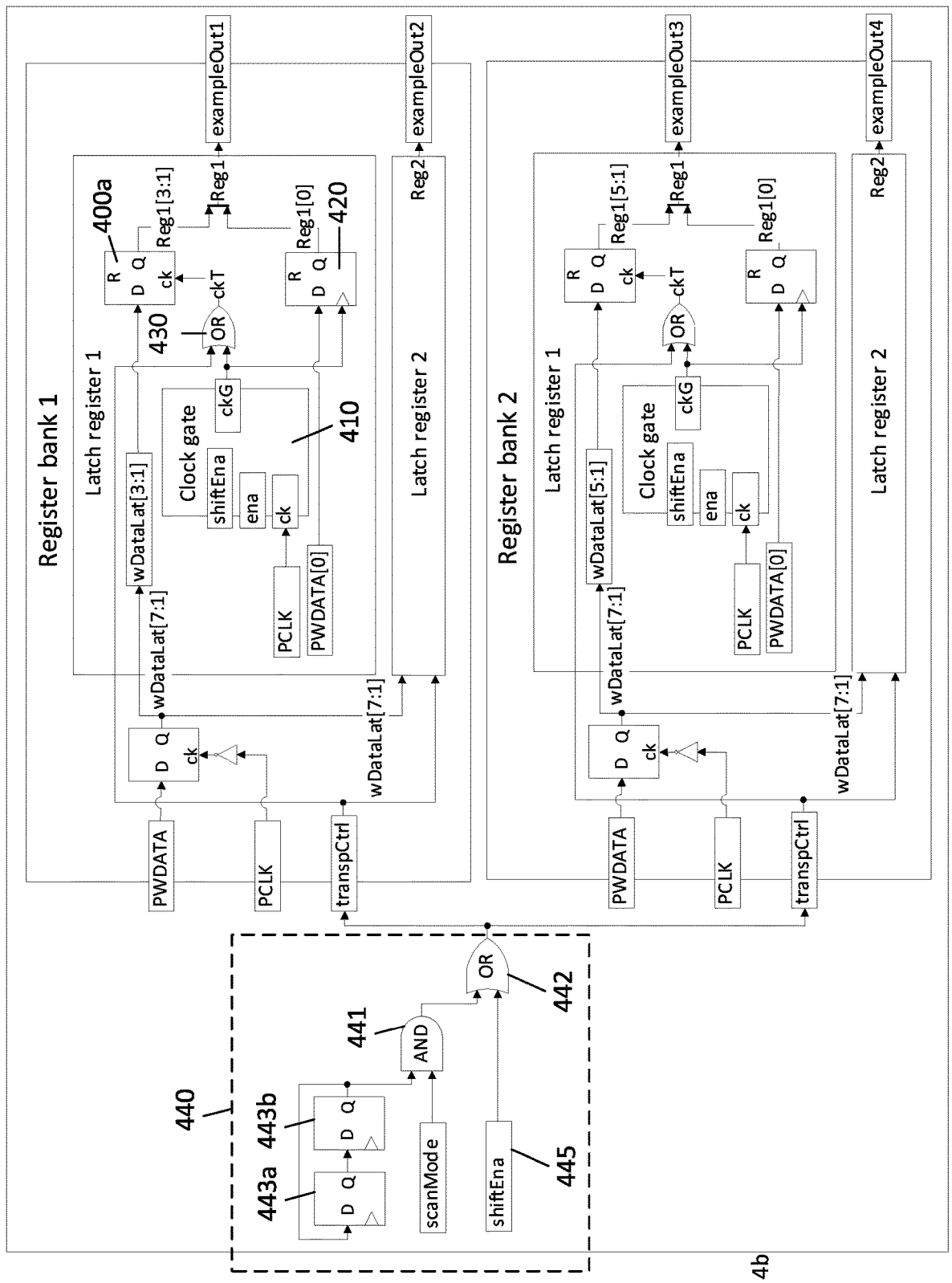
FIG. 4b is a schematic diagram illustrating the register of FIG. 4a and the integrated circuitry further comprising transparency control circuitry for controlling the shift enable signal input to the logical OR gate.

As explained above, the control signal (schematically shown as "ShiftEna" in FIG. 4a) is OR gated with the clock signal ckG to obtain the gating signal for each of the plurality of latches. FIG. 4b schematically illustrates a more detailed example of FIG. 4a, in which the integrated circuitry further comprises control circuitry 440 (also referred to herein as transparent control circuitry) for outputting the control signal (schematically shown as "transpCtrl" in FIG. 4b) to the register. Whilst FIG. 4b shows an example in which the control circuitry 440 comprises the logical OR circuit 442 and the logical AND circuit 441, in a simplest case the control circuitry 440 directly outputs the control signal having a high level when the scan shift enable signal has a high level without OR gating the scan shift enable signal.

As shown in FIG. 4b, the transparent control circuitry 440 outputs the control signal at the logical OR circuit 442 and outputs the control signal to a first register (latch register 1 comprising a plurality of latches and the flip-flop 420) as well as outputting the control signal to a second register (latch register 2 which also comprises a plurality of latches and a flip-flop and may have a same structure as latch register 1 or may store a different number of bits). In addition, in the example of FIG. 4b, the integrated circuitry comprises two register banks and the transparent control circuitry 440 can optionally also output the control signal to the latch registers of the second register bank. In FIG. 4b, each register bank is shown as comprising two latch registers, however, it will be appreciated that each register bank may comprise M respective latch registers, where M may be any suitable value that is greater than or equal to two.

Consequently, the integrated circuit device can include the transparent control circuitry 440 for generating the control signal. By providing the transparent control circuitry 440 and OR gating the control signal with the clock signal generated by each clock gating circuit (e.g. clock gating circuitry 410 for latch register 1) to gate each respective latch included in the register (e.g. latch register 1), each respective latch can be controlled to maintain a transparent state during a scan shift operation.

The use of the logical OR circuit 430 allows the gating signal provided to the latch 400a to have a high level even when the clock signal has a low level. In addition, the transparent control circuitry 440 can be used to provide the control signal to the input of the logical OR circuit 430 and thereby allows the input pin of the logical OR circuit 430 to be fault tested.

Each of the plurality of latch registers includes a respective logical OR circuit that receives the control signal from the transparent control circuitry 440 for controlling the transparency of the latches. Therefore, the same transparent control circuitry 440 can be shared by each latch register by inputting the control signal to each of the respective logical OR circuits. Therefore, each respective logical OR circuit can be stuck-at fault tested using the control circuitry 440. Sharing of the transparent control circuitry 440 by a plurality of latch registers in this way (facilitated using the above mentioned logical OR circuits) contributes to achieving digital logic area savings, and the inclusion of the transparent control circuitry 440 in this way allows each logical OR circuit to be fully stuck-at fault tested.

Moreover, by providing the transparent control circuitry 440 that outputs the control signal to a plurality of respective registers (e.g. latch register 1 and latch register 2), a first plurality of latches in latch register 1 and a second plurality of latches in latch register 2 can each be controlled by the transparent control circuitry 440 thereby allowing significant digital logic area savings. In particular, for a register bank comprising a large number of respective latch registers, each latch register in the register bank can share the same transparent control circuitry 440, thereby allowing significant digital logic area savings.

As shown in FIG. 4b, the transparent control circuitry 440 can output the control signal (in this case shown as "transptCtrl"), and the transparent control circuitry 440 comprises the logical OR circuit 442 configured to output the control signal having the high level when the integrated circuitry is operated in the scan test mode and during the scan shift operation. The logical OR circuit 442 receives a scan shift enable signal 445 having a high level during the scan shift operation. Therefore, the control signal (transptCtrl) having a high level can be output to the latch register during the scan shift operation.

However, by OR gating the scan shift enable signal 445 with the output of the logical AND circuit 441, controllability can be further improved such that a number of respective latch-based registers can be tested simultaneously. Specifically, a test pattern generated by the two scan flip-flops 443a, 443b can be output by the logical AND circuit 441 and thus output by the logical OR circuit 442 even when the scan shift enable signal is in the low state, thereby facilitating testing of a plurality of the latch registers in parallel. In particular, the test pattern output via the logical AND circuit 441 can be used for stuck-at fault testing of the logical OR circuit 430.

An Automatic Test Pattern Generation (ATPG) tool can be used to generate test input signals according to a sequential test pattern comprising a pattern of 0s and 1s, and Automatic Test Equipment (ATE) can be used to scan in a test sequence. The test signals can thus be shifted through flip-flops upstream of the latch 400a and when the latch 400a is in the transparent state the test signals are loaded to the latch 400a, and the two scan flip-flops 443a, 443b can be used to control the transparency of the latch 400a according to a test pattern.

The logical AND circuit 441 acts as a control point that is enabled when the integrated circuit device is operating in the scan test mode and disabled when the integrated circuit device is not operating in the scan test mode (i.e. when operating in a normal function mode). The logical AND circuit 441 receives the scan test mode enable signal ("scanMode") which has a high level when the integrated circuit device operates in the scan test mode. The logical AND circuit 441 also receives a sequential test pattern generated by the two scan flip-flops 443a, 443b, such that the sequential test pattern is AND gated with the scan test mode enable signal. Therefore, when the scan test mode enable signal is high, the output of the AND circuit 441 is determined by the pattern generated by the two flip-flops 443a, 443b.

As shown in FIG. 4b, an output of the first scan flip-flop 443a is connected to an input of the second scan flip-flop 443b, and the transparent control circuitry 440 can thus generate the control signal (provide to the logical OR circuit 430) according to a sequential test pattern.

Figure 5:
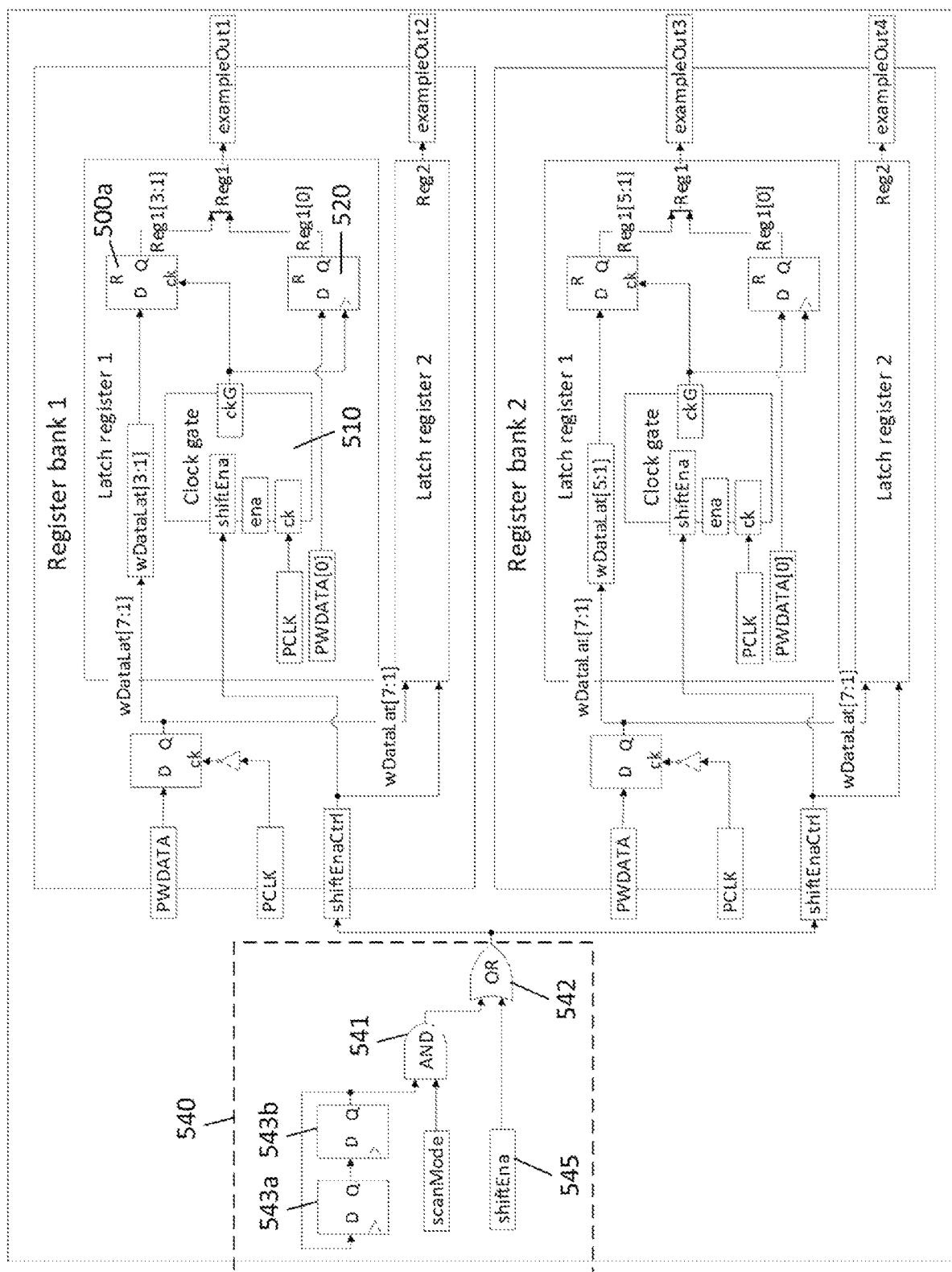
FIG. 5 is a schematic diagram illustrating integrated circuitry comprising scan shift enable control circuitry for controlling the shift enable signal being input to clock gating circuitry of a register.

FIG. 5 schematically illustrates integrated circuitry in accordance with another embodiment of the present invention. The integrated circuitry comprises a latch register (e.g. latch register 1) and also comprises control circuitry 540 (also referred to as scan shift enable control circuitry) for outputting a scan shift enable control signal (shown as "shiftEnaCtrl") to the latch register. The control circuitry 540 is similar to the above mentioned control circuitry 440 but as shown in FIG. 5 the control signal is now output to the clock gating circuitry 510. Whilst FIG. 5 shows an example in which the control circuitry 540 comprises the logical OR circuit 542 and the logical AND circuit 541, in a simplest case the control circuitry 540 directly outputs the control signal having a high level when the scan shift enable signal has a high level without OR gating the scan shift enable signal.

The control circuitry 540 outputs the scan shift enable control signal at the logical OR circuit 542. The scan shift enable control signal is received by the clock gating circuitry 510 of the latch register. As mentioned above, each latch register comprises respective clock gating circuitry, and the clock gating circuitry for each respective latch register can receive the scan shift enable control signal from the control circuitry 540. Therefore, by providing the scan shift enable control signal the control circuitry 540 can enable the clock gating circuitry for each of the plurality of latch registers to output the clock signal during a scan shift operation. In this way, shifting test input signals through the flip-flop in each latch register is not disturbed.

This is shown schematically in FIG. 5, in which the scan shift enable control signal generated by the control circuitry 540 is shared with latch register 1 and latch register 2 of register bank 1. Moreover, the control circuitry 540 can optionally also output the scan shift enable control signal to the latch registers of the second register bank. In this way, the same control circuitry 540 can be shared by each latch register by inputting the scan shift enable control signal to each of the respective clock gating circuits. Sharing of the control circuitry 540 by a plurality of latch registers thus contributes to achieving digital logic area savings. In particular, for a register bank comprising a large number of respective latch registers, each latch register in the register bank can share the same second control circuitry 540, allowing significant digital logic area savings.

As shown in FIG. 5, the scan shift enable control circuitry 540 can output the scan shift enable control signal (in this case shown as "shiftEnaCtrl"), and the control circuitry 540 comprises the logical OR circuit 542 configured to output the scan shift control signal having the high level when the integrated circuitry is operated in the scan test mode and during the scan shift operation. The logical OR circuit 542 receives the scan shift enable signal 545 (in this case shown as "ShiftEna") having a high level during the scan shift operation and accordingly outputs a clock signal for clocking the flip-flop 520. When the logical OR circuit 542 receives the scan shift enable signal 545 having a high level, the logical OR circuit 542 outputs the scan shift enable control signal ("shiftEnaCtrl") having the high level to the latch registers to thereby control the clock gating circuitry 510 to not gate the clock signal. In this way, shifting test input signals through the flip-flop 520 is not disturbed.

However, by OR gating the scan shift enable signal 545 (which may in some cases be enabled for respective latch registers one at a time) with the output of the logical AND circuit 541, controllability can be further improved such that a number of respective latch-based registers can be tested simultaneously. Specifically, a test pattern generated by the two scan flip-flops 543a, 543b can be output by the logical AND circuit 541 and thus output by the logical OR circuit 542 even when the scan shift enable signal is in the low state, thereby facilitating testing of a plurality of the latch registers in parallel.

The logical AND circuit 541 acts as a control point that is enabled when the integrated circuitry is operating in the scan test mode and disabled when the integrated circuitry is not operating in the scan test mode (i.e. when operating in a normal function mode and "scanMode" is low). The logical AND circuit 541 receives the scan test mode enable signal ("scanMode") which has a high level when the integrated circuitry operates in the scan test mode. The logical AND circuit 441 also receives a sequential test pattern generated by the two scan flip-flops 543a, 543b, such that the sequential test pattern is AND gated with the scan test mode enable signal. Therefore, when the scan test mode enable signal is high, the output of the AND circuit 541 is determined by the pattern generated by the two flip-flops 543a, 543b.

As shown in FIG. 5, an output of the first scan flip-flop 543a is connected to an input of the second scan flip-flop 543b, and the control circuitry 540 can thus generate the scan shift enable control signal ("shiftEnaCtrl") according to a sequential test pattern.

Figure 6:
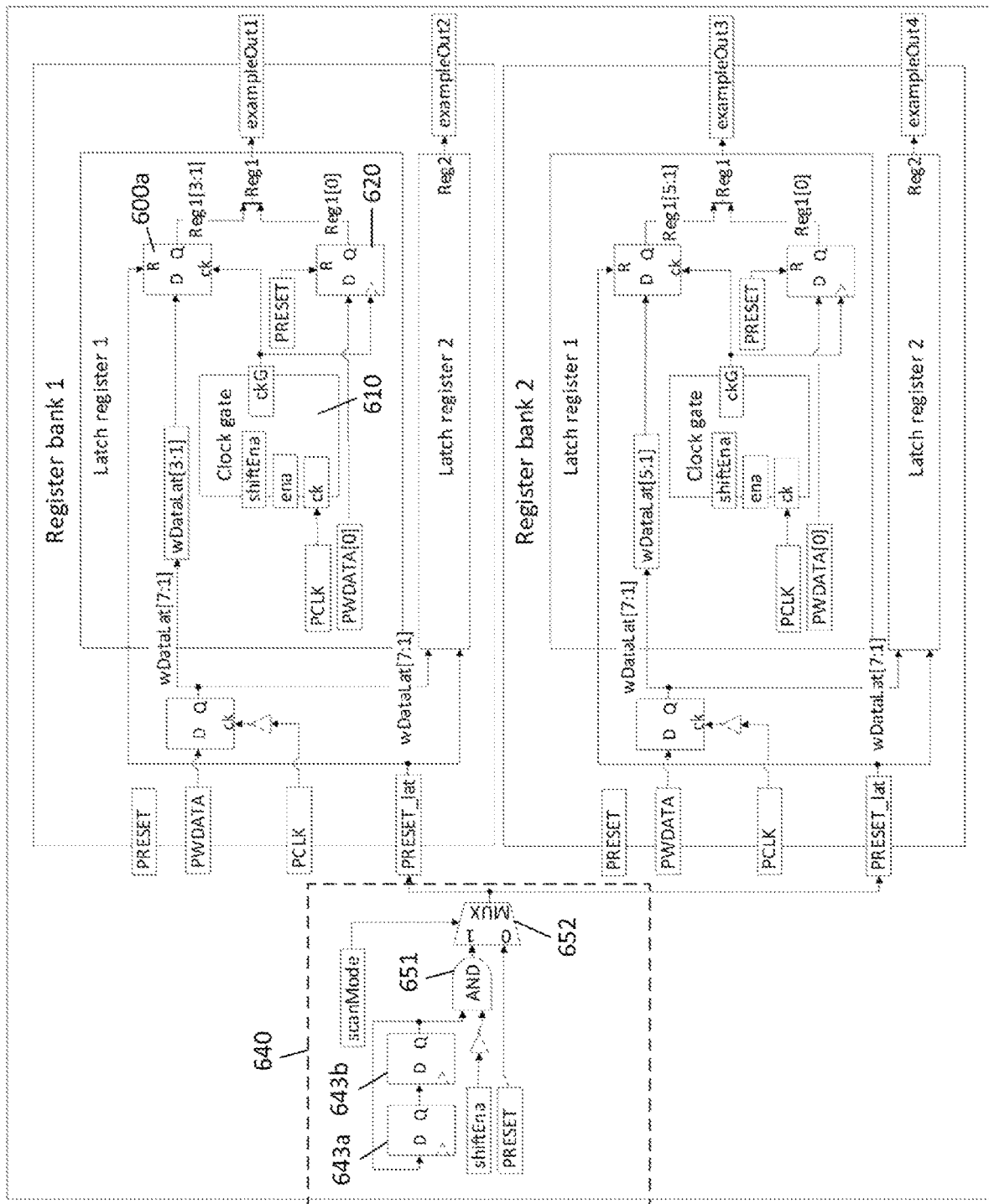
FIG. 6 is a schematic diagram illustrating integrated circuitry comprising reset control circuitry for controlling a reset terminal of a latch.

FIG. 6 schematically illustrates a register in accordance with another embodiment of the present invention. The register comprises a latch 600a comprising a latch reset terminal that receives a reset control signal for resetting the latch 600a to a default binary state. The integrated circuitry further comprises control circuitry 640 (also referred to as reset control circuitry) for generating the reset control signal. The reset control circuitry 640 can thus be used to reset the latch 600a and the functioning of the latch reset terminal of the latch 600a can also be stuck-at tested.

For example, during normal operation of the IC device it is expected that the latch reset terminal of the latch 600a should be used to put the latch 600a into a known state and correct functioning of the latch reset terminal can be an important consideration for testing.

The reset control signal can be used to set the latch 600a to the default binary state at a time such as before or after a scan shift operation. In particular, the reset control signal can be used to set the latch 600a to the default binary state that is different to a current binary state held by the latch 600a, and shifting can be performed to capture the default binary state in a downstream flip-flop, and shifting can be performed to shift-out the default binary state to the primary output pin of the integrated circuit from which an observation can be made to confirm whether the latch reset terminal is stuck or not.

For example, a scan shifting operation can be performed to shift in a value that is opposite to the reset value (default binary state) using one or more upstream flip-flops. A reset can then be performed or not performed, and then followed by capturing the value from the latch in a downstream flip-flop to check whether the observation matches what is expected.

The reset control circuitry 640 comprises a control point so that the reset control circuitry 640 can be disabled during a scan shift operation. Generally, the reset control circuitry 640 can be disabled during a scan shift operation so that resetting of the latch 600a is prevented during a scan shift. The reset control circuitry 640 is enabled when the integrated circuitry is operating in the scan testing mode and not performing scan shift operation so that the latch 600a can be set to a known state before and/or after a scan shift operation.

As shown in FIG. 6, when the integrated circuitry is operating in the normal mode (when the scan test mode signal and the scan shift enable signal are low), the multiplexer 642 selects the normal reset signal (PRESET).

Also shown in FIG. 6, the reset control circuitry 640 comprises a logical AND circuit 651 acting as a control point for disabling the reset control circuitry 640 during a scan shift operation. During a scan shift operation the scan shift enable signal is high. The logical AND circuit 651 receives an inverse of the scan shift enable signal thereby causing the reset control circuitry 640 to be disabled during a scan shift operation. When the integrated circuitry is operating in the scan test mode and the scan shift enable signal is low (i.e. no scan shift operation is being performed), the logical AND circuit 651 outputs the sequential reset pattern generated by the two scan flip-flops 643a and 643b, and the multiplexer 652 selects the input received from the logical AND circuit 651.

Figure 7A:
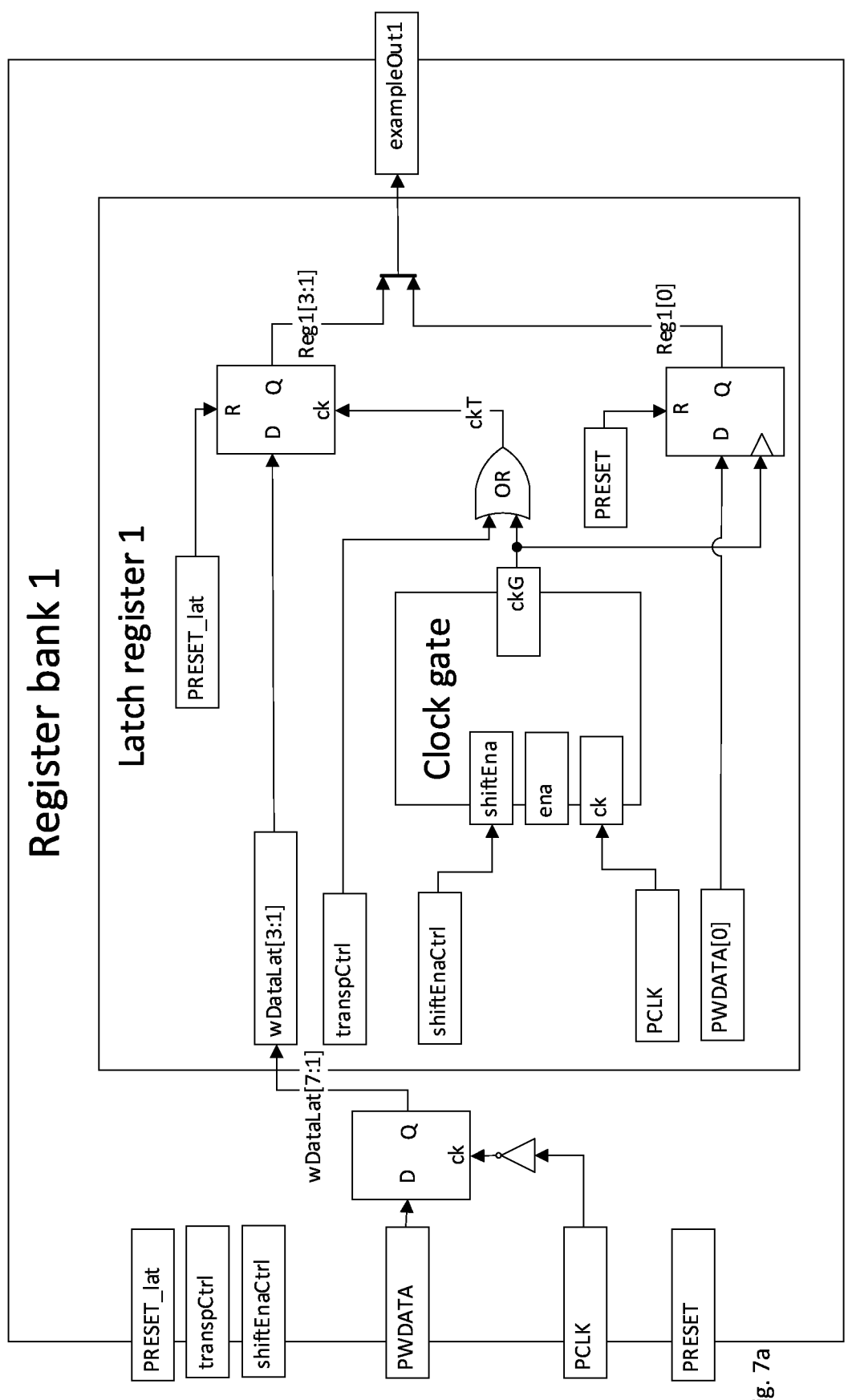
FIGS. 7a and 7b are schematic diagrams illustrating integrated circuitry comprising transparency control circuitry, the scan shift enable control circuitry and the reset control circuitry.

FIG. 7a is a schematic diagram illustrating integrated circuitry comprising a latch register (latch register 1), the control signal ("transptCtrl") input to the latch register by the transparent control circuitry 440, the scan shift enable control signal ("ShiftEnaCtrl") input to the latch register by the scan shift enable control circuitry 540, and the reset control signal ("PRESET_lat") input to the latch register by the reset control circuitry 640. FIG. 7a therefore schematically illustrates an example using a combination of the techniques discussed with above with respect to FIGS. 4a, 4b, 5 and 6. In particular, the transparent control circuitry 440 can be used to control the OR gate 430 in each of the latch registers for improving the testing the OR gate 430, whilst the scan shift enable control circuitry 540 can be used to enable the clock signal circuitry in each of the latch registers for improving the controllability of latches (e.g. 400a) in all the latch registers allowing them to be tested in parallel. Therefore, the combination of the transparent control circuitry 440 and the scan shift enable control circuitry 540, when used together, can yield greater fault coverage.

Figure 7B:
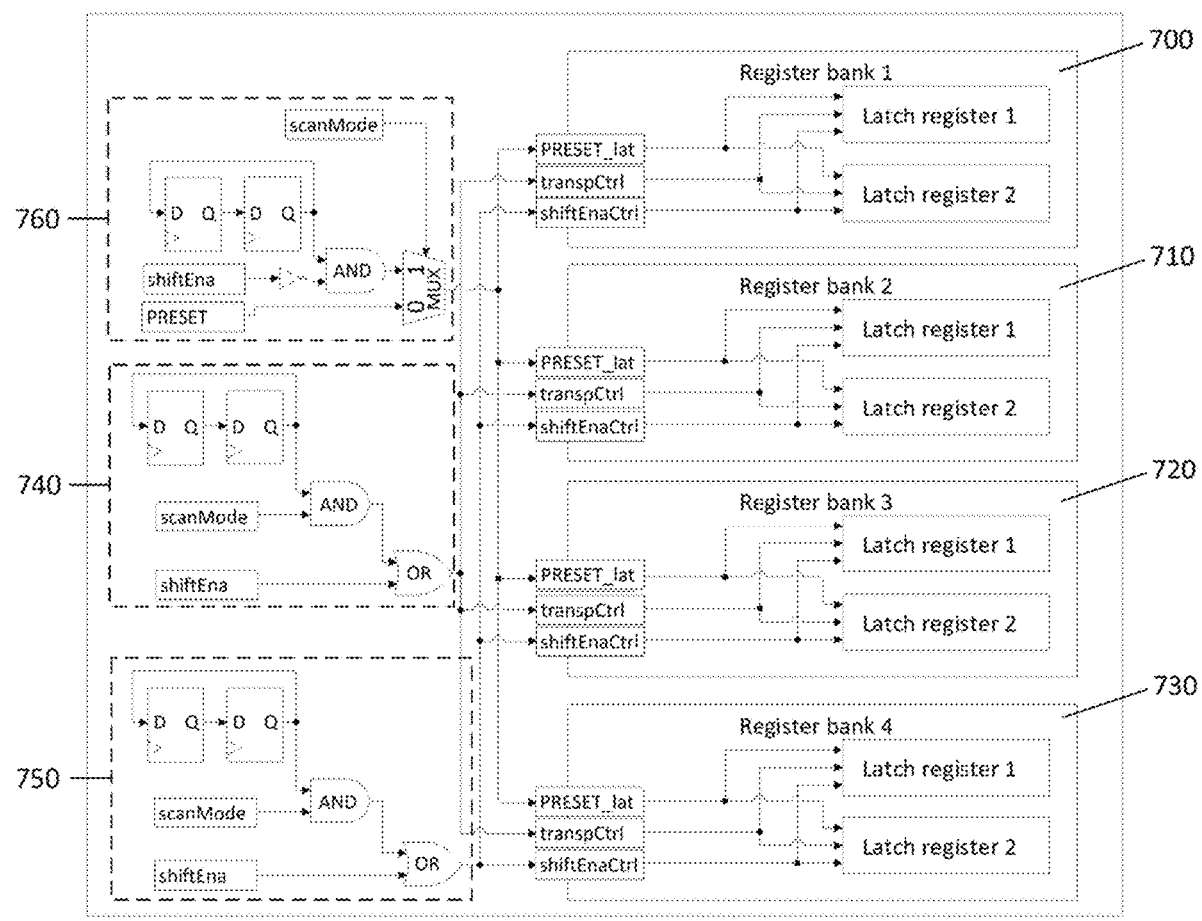

FIG. 7b, is a schematic diagram illustrating integrated circuitry comprising transparent control circuitry 740 (being the same as the transparent control circuitry 440), scan shift enable control circuitry 750 (being the same as the scan shift enable control circuitry 540) and reset control circuitry 760 (being the same as the reset control circuitry 640). In this example, the integrated circuitry further comprises registers banks 700, 710, 720 and 730 which each comprise a plurality of latch registers. As shown in FIG. 7b, the transparent control circuitry 740, scan shift enable control circuitry 750 and reset control circuitry 760 can be shared by each of the plurality of latch registers which provides significant digital logic area savings.

Some embodiments of the invention provide a power management integrated circuit (PMIC) comprising the integrated circuitry having any of the configurations disclosed above. In particular, embodiments of the invention provide a power management integrated circuit comprising the features shown in FIG. 7b.

Electronic devices, and in particular battery-operated devices, typically include one or more PMICs for power management. A PMIC typically comprises regulators and converters and their associated digital logic circuits so as to regulate voltages supplied from a power source (e.g. a rechargeable battery) to obtain one or more internal supply voltages for powering the electronic device. In particular, a PMIC typically comprises digital logic including banks of registers (e.g. control registers and status registers) that a host SoC can write to and read from in order to control the PMIC and read the status of the PMIC.

Cost, size, and power consumption are important characteristics of PMICs.

Embodiments of the present invention provide a power management integrated circuit comprising at least one n-bit latch register comprising a plurality of latches and a flip-flop, and the use of the latch register contributes to a reduction in the size of the integrated circuit (or at least the digital logic area associated with the register functionality).

It will be appreciated by those skilled in the art that the embodiments of the invention described above has significant potential advantages. It will also be apparent that numerous modifications and variations of the present disclosure are possible in light of the above teachings. It is therefore to be understood that within the scope of the appended claims, the disclosure may be practised otherwise than a specifically described herein.

The invention claimed is:

1. An integrated circuit device including:
an n-bit register comprising:
a plurality of latches and at least one flip-flop, the plurality of latches and the flip-flop each being configured to store respective binary states corresponding to respective bits, wherein each of the plurality of latches is level-triggered and the flip-flop is edge-triggered and n is greater than or equal to three;
clock gating circuitry configured to generate a clock signal for the register and to output the clock signal at a clock signal output terminal of the clock gating circuitry; and
coupling circuitry configured to couple the clock signal output terminal of the clock gating circuitry to each of the plurality of latches and the flip-flop,
wherein each latch of the plurality of latches comprises a latch gating terminal configured to receive a gating signal, wherein a respective latch is configured to receive the gating signal that either corresponds to the clock signal or is determined according to a logical operation including the clock signal such that a transparency for each respective latch is controlled in dependence upon a level of the gating signal;
wherein the at least one flip-flop comprises a gating terminal configured to receive the clock signal such that loading of the flip-flop is controlled in dependence upon an edge of the clock signal received at the gating terminal; and
wherein the integrated circuit device is configured to operate in a scan test mode for scan testing at least some of the integrated circuit device, wherein when in the scan test mode and during a scan shift operation an input signal terminal of the flip-flop is configured to receive a test input signal and the flip-flop is configured to load the test input signal to an output signal terminal of the flip-flop responsive to an edge of the clock signal received at the gating terminal,
and wherein the integrated circuit device comprises at least one output pin to provide an observation point for the flip-flop.

2. The integrated circuit device according to claim 1, wherein the at least one flip-flop is included in a scan chain comprising a chain of flip-flops, and wherein the output pin is coupled to an output signal pin of a downstream flip-flop that is downstream from the at least one flip-flop in the scan chain.

3. The integrated circuit device according to claim 1, and configured so that each of the plurality of latches is in a transparent state when the gating signal has a high level and each of the plurality of latches is not in the transparent state when the gating signal has a low level, wherein when in the transparent state each latch is configured to load an input signal at a latch input signal terminal of the latch and to provide the input signal to a latch output terminal of the latch.

4. The integrated circuit device according to claim 3, wherein when in the scan test mode and during the scan shift operation, the integrated circuit device is configured to provide the gating signal having a high level to a latch gating terminal of a latch to maintain the latch in the transparent state during the scan shift operation.

5. The integrated circuit device according to claim 4, further comprising control circuitry configured to output a control signal to the n-bit register to maintain the latch in the transparent state during the scan shift operation, wherein the control circuitry is configured to output the control signal having the high level when the integrated circuit device is operated in the scan test mode and during the scan shift operation.

6. The integrated circuit device according to claim 5, wherein the control circuitry comprises logical OR circuitry configured to receive a scan shift enable signal having a high level during the scan shift operation and to output the control signal having the high level during the scan shift operation, and wherein the control circuitry further comprises a control point comprising logical AND circuitry configured to receive a scan test mode enable signal and a supplementary control signal, wherein the scan test mode enable signal has a high level when the integrated circuit device is operated in the scan test mode, wherein the logical OR circuitry is configured to receive a signal output by the logical AND circuitry such that the logical OR circuitry is configured to output the control signal having the high level when the supplementary control signal has a high level and the scan test mode enable signal has the high level.

7. The integrated circuit device according to claim 6, wherein the control circuitry comprises a first scan flip-flop and a second scan flip-flop, wherein an output of the first scan flip-flop is connected to an input of the second scan flip-flop, and the control circuitry is configured to generate the supplementary control signal according to a sequential test pattern.

8. The integrated circuit device according to claim 5, wherein the coupling circuitry comprises a latch signal path configured to couple the clock signal output terminal to each of the plurality of latches, the latch signal path comprising a logical OR circuit configured to receive the clock signal and the control signal, the logical OR circuit being configured to output, to the latch gating terminal of each of the plurality of latches, the gating signal in dependence upon a logical OR operation for the clock signal and the control signal, wherein the integrated circuit device is configured to provide, to the logical OR circuit, the control signal having a high level during the scan shift operation.

9. The integrated circuit device according to claim 8, further comprising a second register comprising a second plurality of latches, a second flip-flop and second clock gating circuitry, and wherein the control circuitry is also configured to output the control signal to the second register to maintain each of the second plurality of latches in the transparent state during the scan shift operation.

10. The integrated circuit device according to claim 9, wherein the second register comprises second coupling circuitry comprising a second latch signal path configured to couple a second clock signal output terminal of the second clock gating circuitry to each of the second plurality of latches, and wherein the second latch signal path comprises a second logical OR circuit configured to receive the control signal and a second clock signal generated by the second clock gating circuitry, the second logical OR circuit being configured to output, to a latch gating terminal of each of the second plurality of latches, a gating signal in dependence upon a logical OR operation for the second clock signal and the control signal.

11. The integrated circuit device according to claim 1, further comprising scan shift enable control circuitry configured to output a scan shift enable control signal to the n-bit register, wherein the clock gating circuitry comprises a shift enable control input terminal configured to receive the scan shift enable control signal and the clock gating circuitry is configured to output the clock signal at the clock signal output terminal in dependence upon the scan shift enable control signal so that the clock signal is enabled for the n-bit register during the scan shift operation, such that the gating terminal of the at least one flip-flop is configured to receive the clock signal during the scan shift operation.

12. The integrated circuit device according to claim 11, further comprising a plurality of registers each comprising: a plurality of latches, at least one flip flop; and clock gating circuitry comprising a shift enable control input terminal, and wherein the scan shift enable control signal control circuitry is also configured to output the scan shift enable control signal to each of the plurality of registers to enable the clock gating circuitry of each of the plurality of registers during the scan shift operation so that the clock gating circuitry of each of the plurality of registers is configured to output the clock signal during the scan shift operation.

13. The integrated circuit device according to claim 1, wherein at least one of the plurality of latches comprises a latch reset terminal configured to receive a reset control signal for resetting the latch to a default binary state, and wherein the integrated circuit device further comprises reset control circuitry configured to output the reset control signal to the n-bit register.

14. The integrated circuit device according to claim 13, wherein the reset control circuitry comprises a control point and the integrated circuit device is configured to disable the control point during the scan shift operation.

15. The integrated circuit device according to claim 14, wherein the control point comprises logical AND circuitry configured to receive a supplementary reset control signal and an inverse of a scan shift enable signal and to output the reset control signal in dependence upon the received signals so that resetting of the respective latch to the default binary state is disabled during the scan shift operation, and wherein the reset control circuitry further comprises a multiplexer control point configured to select and output the reset control signal when the integrated circuit device is operated in the scan test mode.

16. The integrated circuit device according to claim 13, further comprising a second register comprising a second plurality of latches, a second flip-flop and second clock gating circuitry, and wherein the reset control circuitry is configured to output the reset control signal to the second register for resetting one or more of the second plurality of latches to the default binary state.

17. The integrated circuit device according to claim 13, wherein the reset control circuitry comprises a first scan flip-flop and a second scan flip-flop, wherein an output of the first scan flip-flop is connected to an input of the second scan flip-flop, and the reset control circuitry is configured to generate the supplementary reset control signal according to a sequential test pattern.

18. The integrated circuit device according to claim 13, wherein the latch is configured to store a binary state from a previous scan shift operation, and when in the scan test mode and before the scan shift operation, the integrated circuit device is configured to provide, to the latch reset terminal of the latch, the reset control signal for resetting the latch to the default binary state, wherein during the scan shift operation the integrated circuit device is configured to capture the default binary state in a downstream flip-flop, and wherein the integrated circuit device is configured to shift the default binary state downstream from the downstream flip-flop to the or another output pin of the integrated circuit device to provide an observation.

19. The integrated circuit device according to claim 1, wherein each of the plurality of latches is a positive level active latch comprising a latch input signal terminal connected to a respective negative level active latch of a plurality of negative level latches for receiving an input signal from the respective negative level active latch, and wherein at least one negative level active latch has a latch output terminal coupled to a first latch input terminal of a first latch in the n-bit register and also coupled to another latch input terminal of another latch in another latch register.

20. The integrated circuit device according to claim 1, wherein the plurality of latches and each of the one or more flip-flops are arranged in parallel with each other.

21. The integrated circuit device according to claim 1, wherein the n-bit register comprises fewer than n flip-flops.

22. The integrated circuit device according to claim 1, wherein the n-bit register comprises n−1 latches and the flip-flop.

* * * * *